(12) United States Patent
Kim (10) Patent No.: US 9,123,761 B2
(45) Date of Patent: Sep. 1, 2015

(54) SUBSTRATE TRANSFERRING DEVICE

(71) Applicant: Samsung Display Co., Ltd., Yongin, Gyeonggi-do (KR)

(72) Inventor: Hee Seok Kim, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/028,213

(22) Filed: Sep. 16, 2013

(65) Prior Publication Data
US 2014/0151194 A1 Jun. 5, 2014

(30) Foreign Application Priority Data

Dec. 5, 2012 (KR) .......................... 10-2012-0140362

(51) Int. Cl.
*B65G 13/12* (2006.01)
*H01L 21/677* (2006.01)
*B65G 21/20* (2006.01)
*B65G 13/11* (2006.01)

(52) U.S. Cl.
CPC .......... *H01L 21/67706* (2013.01); *B65G 13/11* (2013.01); *B65G 13/12* (2013.01); *B65G 21/2072* (2013.01)

(58) Field of Classification Search
CPC ............................. B65G 13/12; B65G 21/2072
USPC ........ 198/782, 785, 786, 836.1, 836.3, 836.4; 414/535; 193/35 SS, 35 C
See application file for complete search history.

(56) References Cited

U.S. PATENT DOCUMENTS

| 935,669 | A | * | 10/1909 | Logan ........................ 193/35 C |
| 3,176,828 | A | * | 4/1965 | Sullivan ....................... 198/783 |
| 2004/0099511 | A1 | * | 5/2004 | Nas et al. .................... 198/836.1 |

FOREIGN PATENT DOCUMENTS

| JP | 08-276166 A | | 10/1996 |
| KR | 10-2011-0056029 A | | 5/2011 |
| KR | 10-2011-0063016 A | | 6/2011 |
| KR | 2012025360 A | * | 3/2012 |

* cited by examiner

*Primary Examiner* — Leslie A Nicholson, III
(74) *Attorney, Agent, or Firm* — Knobbe, Martens, Olson & Bear, LLP (57) ABSTRACT

A substrate transferring device is disclosed. In one aspect, the substrate transferring device includes substrate to transfer the substrate in one direction and a plurality of side rollers. Each roller includes a side roller main body configured to rotate while contacting a side surface of the substrate to prevent the substrate from being deviated from the one direction. The roller also includes a side roller support which is coupled to a lower part of the side roller main body or a lower part of the side roller main body when the side roller main body is turned upside down in a vertical direction to vary a position of a contact line where the side surface of the substrate is in contact with the side roller main body. The roller further includes a fixing member which is coupled to the side roller support inside the side roller main body.

19 Claims, 8 Drawing Sheets

SUBSTRATE TRANSFERRING DEVICE

CROSS-REFERENCE TO RELATED APPLICATION

This application claims priority from Korean Patent Application No. 10-2012-0140362 filed on Dec. 5, 2012 in the Korean Intellectual Property Office, and all the benefits accruing therefrom under 35 U.S.C. 119, the contents of which in its entirety are herein incorporated by reference.

BACKGROUND

1. Technical Field

The described technology generally relates to a substrate transferring device.

2. Description of the Related Technology

In recent years, an information processing apparatus is being developed rapidly to have various types of functions and faster speed of processing information. This information processing apparatus includes a display device to display the processed information. A flat panel display such as a liquid crystal display, an organic light emitting diode (OLED) display, and a plasma display is currently attracting attention.

The flat panel display generally includes a substrate on which a multiple thin film structure and a wiring pattern are formed. In order to form a thin film and/or pattern on the substrate, a variety of manufacturing processes such as deposition, baking, etching, cleaning and drying are generally required. Each process is mainly performed in a process chamber. In order to perform a series of the required processes, the substrate needs to be transferred into the process chamber. For this, a substrate transferring device is installed between the process chambers.

SUMMARY

One inventive aspect is a substrate transferring device capable of increasing the replacement cycle of side rollers.

Another aspect is a substrate transferring device including: a plurality of transfer rollers which are rotated in contact with a lower surface of a substrate to transfer the substrate in one direction; and a plurality of side rollers, each including a side roller main body which is rotated in contact with a side surface of the substrate to prevent the substrate from being deviated from the one direction, a side roller support which is coupled to a lower part of the side roller main body or a lower part of the side roller main body when the side roller main body is turned upside down in a vertical direction to vary a position of a contact line where the side surface of the substrate is in contact with the side roller main body, and a fixing member which is coupled to the side roller support inside the side roller main body.

Another aspect is a substrate transferring device including: a plurality of transfer rollers which are rotated in contact with a lower surface of a substrate to transfer the substrate in one direction; and a plurality of side rollers, each including a side roller main body which is rotated in contact with a side surface of the substrate to prevent the substrate from being deviated from the one direction, a side roller support which is coupled to a lower part of the side roller main body or a detachable washer coupled to the lower part of the side roller main body to vary a position of a contact line where the side surface of the substrate is in contact with the side roller main body, and a fixing member which is coupled to the side roller support inside the side roller main body.

DETAILED DESCRIPTION

A substrate transferring device generally includes a plurality of transfer rollers which are rotated in contact with the lower surface of the substrate to transfer the substrate in one direction, and a plurality of side rollers which are rotated in contact with the side surface of the substrate to prevent the substrate from being deviated from the one direction.

If the side rollers are used several times while being in contact with the side surface of the substrate, a crack may occur in the side rollers along a contact line where the side surface of the substrate is in contact with the side rollers. In this case, since it is difficult for the side rollers to prevent the deviation of the substrate, the side rollers need to be replaced immediately when a crack occurs in the side rollers. Accordingly, the replacement cycle of the rollers is short, and the cost for the replacement of the side rollers has increased.

The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments will be described with reference to the accompanying drawings.

Figure 1:
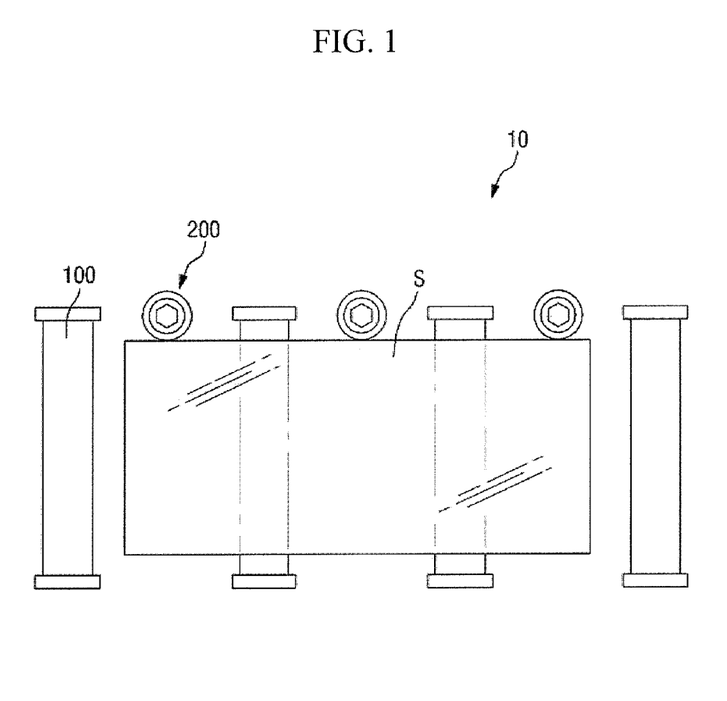
FIG. 1 is a schematic diagram showing a substrate transferring device in accordance with an embodiment.

FIG. 1 is a schematic diagram showing a substrate transferring device in accordance with an embodiment.

Referring to FIG. 1, a substrate transferring device 10 may be a device for transferring a substrate S in one direction, and may include a plurality of transfer rollers 100 and a plurality of side rollers 200.

The transfer rollers 100 are arranged to be spaced from each other in a row, and are rotated in contact with the lower surface of the substrate S to transfer the substrate S in one direction. Although not shown, the rotation of the transfer rollers 100 can be achieved by a rotation driving device. The substrate S may be a substrate for a display. For example, the substrate S may be a substrate for a flat panel display such as an organic light emitting display device, a liquid crystal display device, and a plasma display device. The substrate S may be a bare substrate, or a substrate on which a structure such as a thin film and wiring is formed.

The side rollers 200 are rotated in contact with one of the side surfaces of the substrate S to prevent the substrate S, which is transferred in one direction by the transfer rollers 100, from being deviated from the one direction. Although not shown, the rotation of the side rollers 200 can be achieved by a rotation driving device. Although the side rollers 200 are disposed in contact with one side surface of the substrate S in FIG. 1, the side rollers 200 may be disposed in contact with two side surfaces facing each other among the side surfaces of the substrate S.

Figure 2:
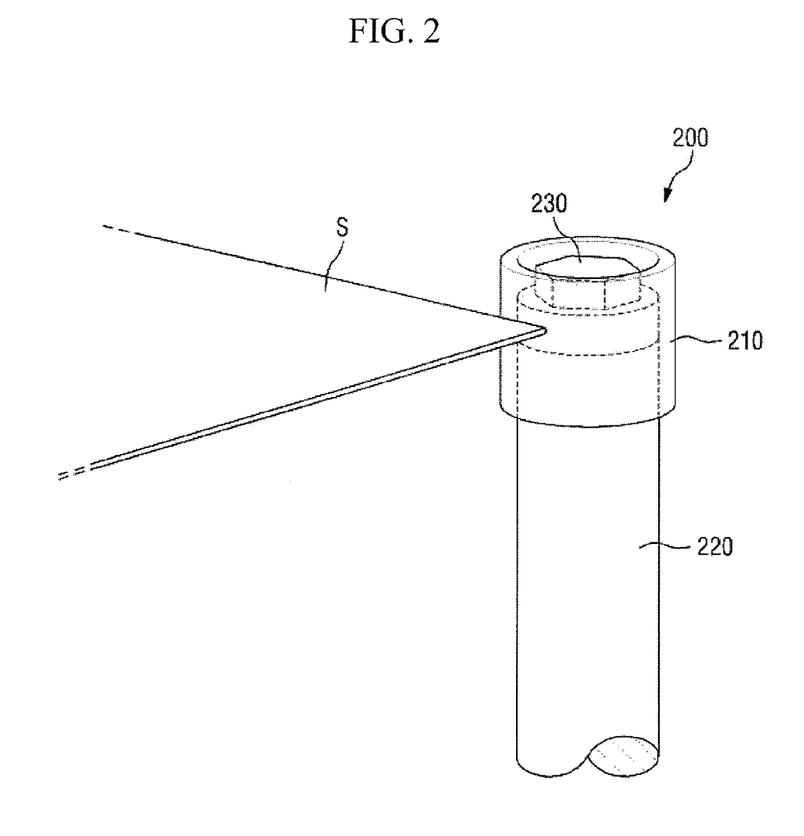
FIG. 2 is a perspective view of a side roller in the substrate transferring device of FIG. 1.
Figure 3:
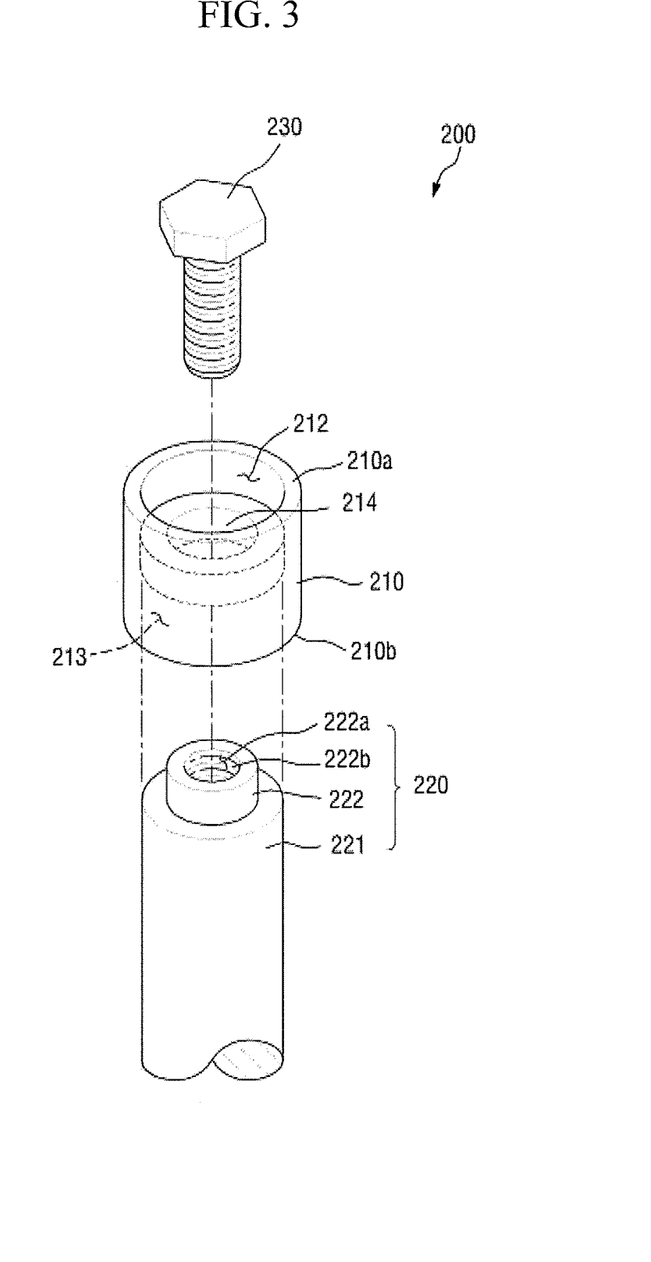
FIG. 3 is an exploded perspective view of the side roller of FIG. 2.
Figure 4:
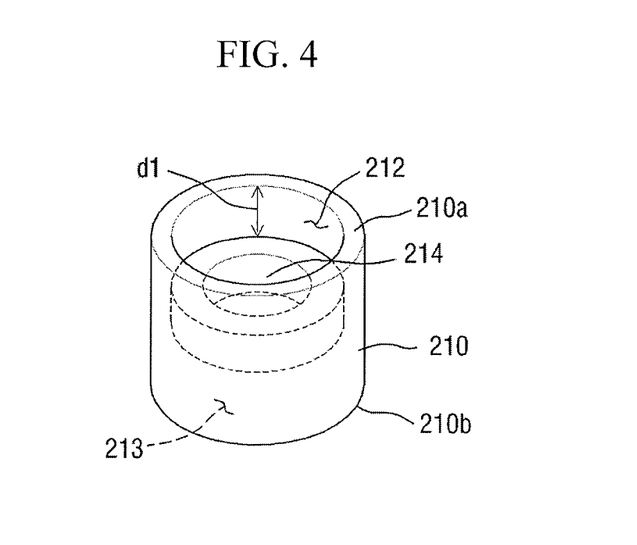
FIG. 4 is a perspective view showing an upper part of a side roller main body of the side roller of FIG. 2.
Figure 5:
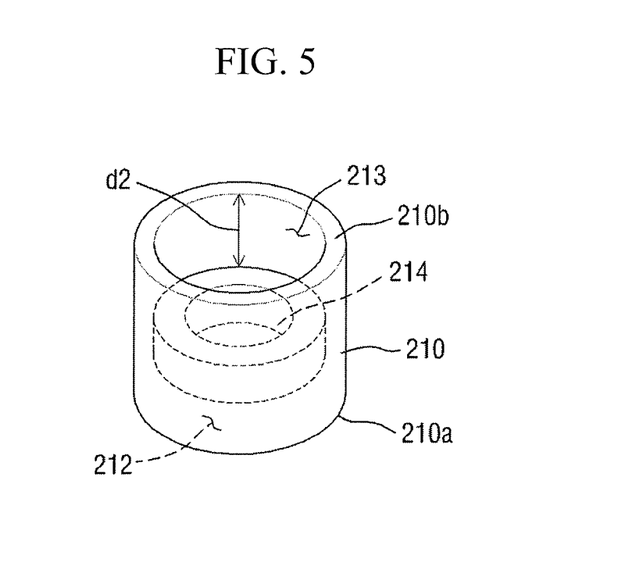
FIG. 5 is a perspective view showing a state where the side roller main body of FIG. 4 is turned upside down in the vertical direction.

Next, the side rollers 200 will be described in detail. FIG. 2 is a perspective view of a side roller in the substrate transferring device of FIG. 1. FIG. 3 is an exploded perspective view of the side roller of FIG. 2. FIG. 4 is a perspective view showing an upper part of a side roller main body of the side roller of FIG. 2. FIG. 5 is a perspective view showing a state where the side roller main body of FIG. 4 is turned upside down in the vertical direction.

Referring to FIG. 2, each of the side rollers 200 includes a side roller main body 210, a side roller support 220 which is coupled to a lower part of the side roller main body 210, and a fixing member 230 which is coupled to the side roller support 220 inside the side roller main body 210.

The side roller main body 210 is substantially in contact with the side surface of the substrate S when the substrate S is transferred by the transfer rollers 100, and may be formed in a column shape. The side roller main body 210 includes, as shown in FIG. 3, a first space 212, a second space 213, and a fixing hole 214.

The first space 212 is a space having a first depth d1 in the vertical direction from an upper surface 210a of the side roller main body 210 as shown in FIG. 4. The first space 212 may provide a space where the fixing member 230, which is coupled to the side roller support 220, is seated in the side roller main body 210. Further, the first space 212 may provide a space where the side roller support 220, which is coupled with the fixing member 230, is seated in the side roller main body 210 in the case where the side roller main body 210 is turned upside down in the vertical direction.

The second space 213 is a space having a second depth d2 different from the first depth d1 in the vertical direction from a lower surface 210b of the side roller main body 210 as shown in FIG. 5. For example, the second depth d2 may be greater than the first depth d1. The second space 213 may provide a space where the side roller support 220, which is coupled with the fixing member 230, is seated in the side roller main body 210. Further, the second space 213 may provide a space where the fixing member 230, which is coupled with the side roller support 220, is seated in the side roller main body 210 in the case where the side roller main body 210 is turned upside down in the vertical direction.

The fixing hole 214 connects the first space 212 with the second space 213 and provides a space which a portion of the side roller support 220 is inserted.

The side roller support 220 includes a support main body 221 and a support coupling portion 222 as shown in FIG. 3.

The support main body 221 is formed in a column shape and serves to support the side roller main body 210. The support main body 221 is seated in the second space 213 when the side roller support 220 is coupled to the lower part of the side roller main body 210, or seated in the first space 212 when the side roller support 220 is coupled to the lower part of the side roller main body 210 in the case where the side roller main body 210 is turned upside down.

The support coupling portion 222 is formed in a column shape on the support main body 221, and has a through hole 222a which is coupled with the fixing member 230. A thread 222b may be formed on the inner surface of the through hole 222a. The support coupling portion 222 has a diameter smaller than that of the support main body 221, and is inserted into the fixing hole 214. The support coupling portion 222 may be coupled with or separated from the fixing member 230.

The fixing member 230 is coupled with the side roller support 220 in the side roller main body 210 to fix the side roller support 220 to the side roller main body 210. The fixing member 230 may be configured as a bolt and coupled with the through hole 222a of the support coupling portion 222.

Next, a description will be provided with respect to a position of a contact line where the substrate S is in contact with the side roller main body 210 in two scenarios. In the first scenario, the side roller support 220 is coupled when the side roller main body 210 is disposed at a normal position. In the second scenario, the side roller support 220 is coupled when the side roller main body 210 is disposed while being turned upside down in the vertical direction in the side roller 200 having the above configuration. The first scenario may include a situation where the upper surface 210a of the side roller main body 210 is disposed in the upward direction and the lower surface 210b of the side roller main body 210 is disposed in the downward direction as shown in FIG. 4. The second scenario may include a situation where the upper surface 210a of the side roller main body 210 is disposed in the downward direction and the lower surface 210b of the side roller main body 210 is disposed in the upward direction as shown in FIG. 5.

Figure 6:
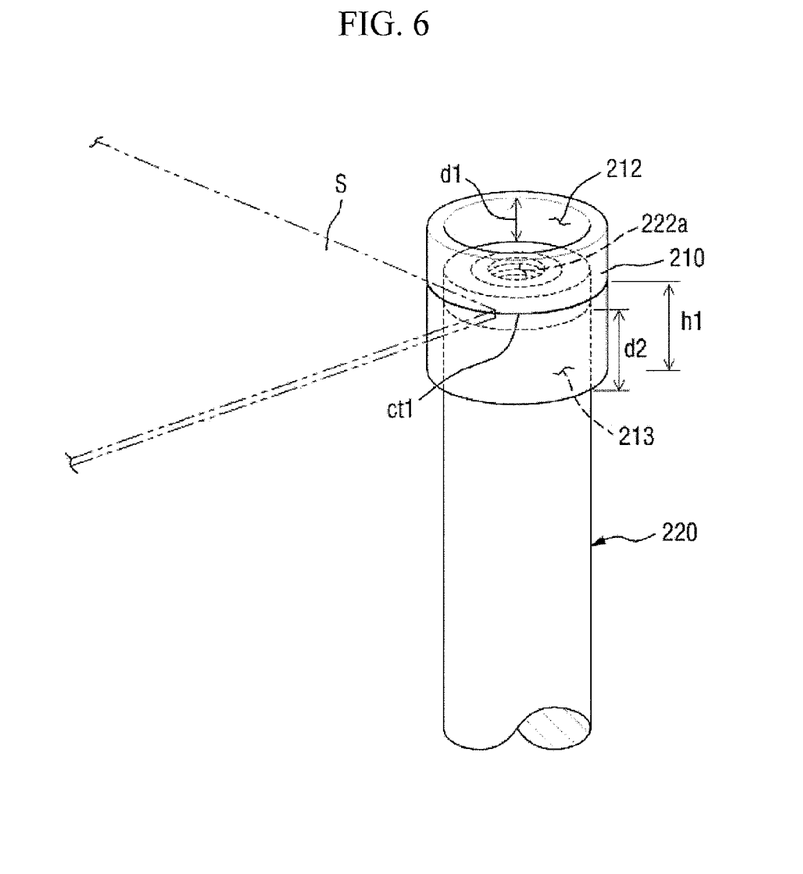
FIG. 6 is a perspective view showing a contact line where the side surface of the substrate is in contact with the side roller main body in a case where the support is coupled in the state of the side roller main body shown in FIG. 4.
Figure 7:
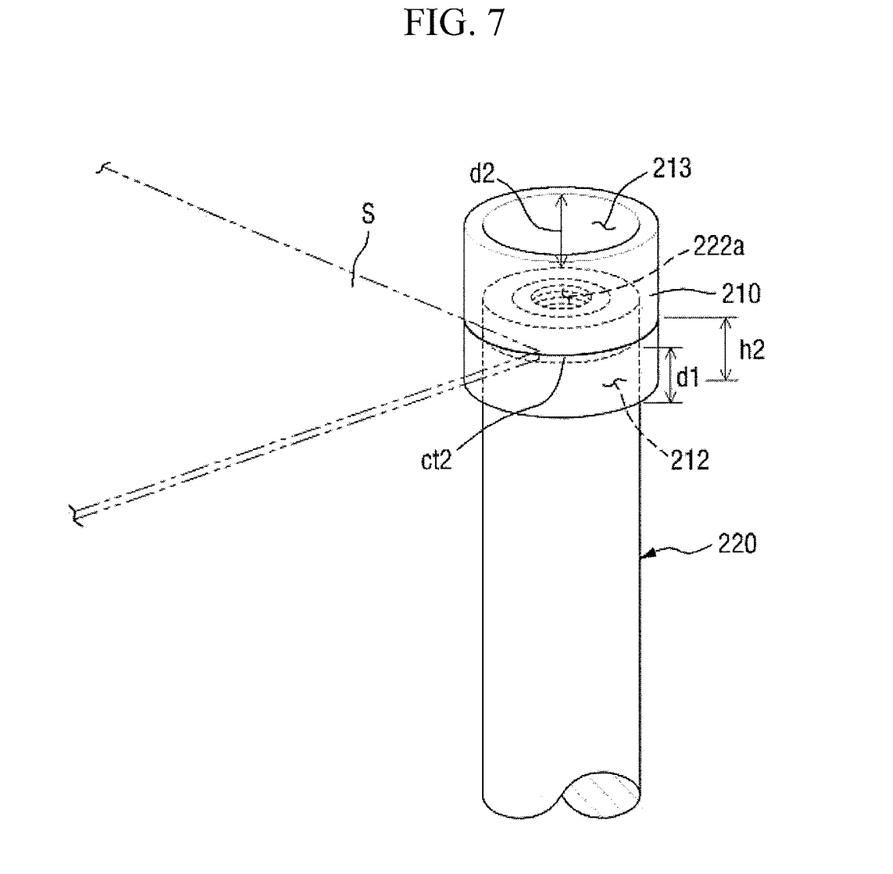
FIG. 7 is a perspective view showing a contact line where the side surface of the substrate is in contact with the side roller main body in a case where the support is coupled in the state of the side roller main body shown in FIG. 5.

FIG. 6 is a perspective view showing a contact line where the side surface of the substrate is in contact with the side roller main body in a case where the support is coupled in the state of the side roller main body shown in FIG. 4. FIG. 7 is a perspective view showing a contact line where the side surface of the substrate is in contact with the side roller main body in a case where the support is coupled in the state of the side roller main body shown in FIG. 5. In FIGS. 6 and 7, the fixing member 230 has been omitted.

Referring to FIG. 6, in the case where the side roller main body 210 is disposed at the normal position, the side roller support 220 is coupled with the second space 213 having the second depth d2. In this case, when the substrate S is transferred by the transfer rollers 100 (see FIG. 1), a contact line ct1 where the side surface of the substrate S is in contact with the side roller main body 210 is positioned to be spaced by a first height h1 from the lower end of the side roller main body 210.

Referring to FIG. 7, in the case where the side roller main body 210 is disposed while being turned upside down in the vertical direction, the side roller support 220 is coupled with the first space 212 having the first depth d1. In this case, when the substrate S is transferred by the transfer rollers 100 (see FIG. 1), a contact line ct2 where the side surface of the substrate S is in contact with the side roller main body 210 is positioned to be spaced, by a second height h2 different from the first height h1, from the lower end of the side roller main body 210.

As described above, the substrate transferring device 10 in accordance with the embodiment of the present invention comprises the side roller main body 210 including the first space 212 having the first depth d1 in the upper part and the second space 213 having the second depth d2 different from the first depth d1 in the lower part. Accordingly, it is possible to vary the position of the contact line where the side surface of the substrate S is in contact with the side roller main body 210 in the case where the side roller main body 210 is disposed at the normal position and the case where the side roller main body 210 is disposed while being turned upside down in the vertical direction.

Thus, according to at least one of the disclosed embodiments, even though a crack occurs in the side roller main body 210 along the contact line ct1 when the substrate S is transferred while the side roller main body 210 is disposed at the normal position, the side roller main body 210 may be reused while being turned upside down in the vertical direction without replacing the side roller main body 210. Thus, it is possible to increase the replacement cycle of the side roller main body 210.

Figure 8:
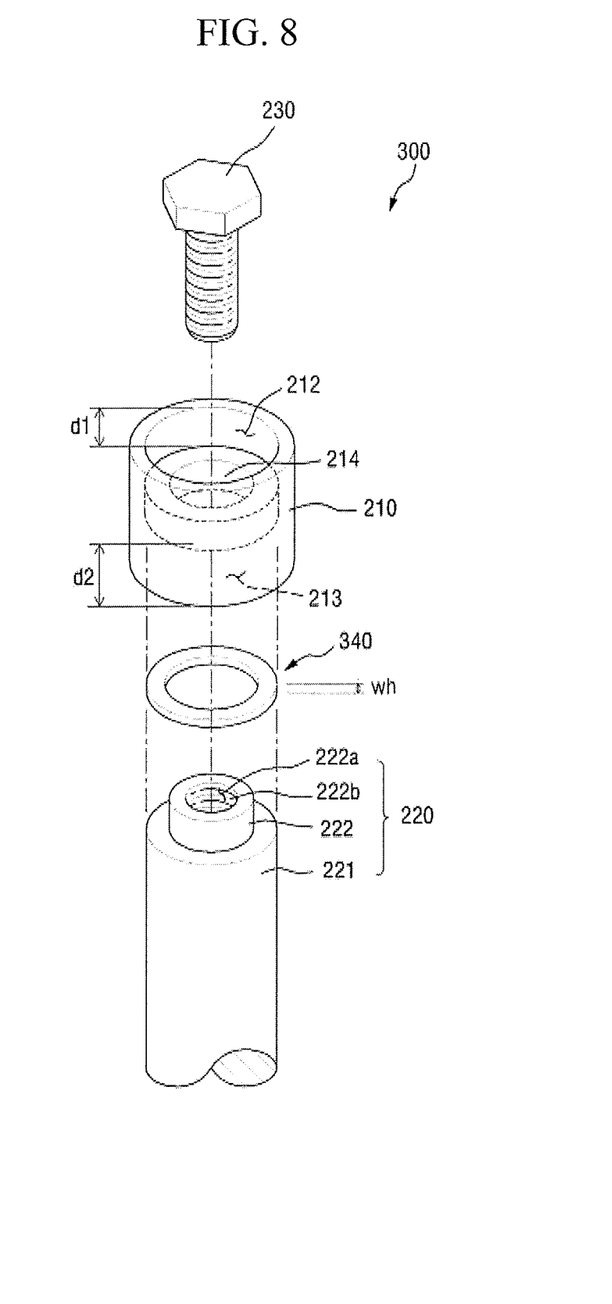
FIG. 8 is an exploded perspective view showing a side roller of a substrate transferring device in accordance with another embodiment.

FIG. 8 is an exploded perspective view showing a side roller of a substrate transferring device in accordance with another embodiment. The FIG. 8 embodiment has substantially the same configuration as the FIG. 1 embodiment except that a side roller 300 further includes a washer 340. Accordingly, a repeated description thereof will be omitted.

Referring to FIG. 8, the side roller 300 includes the side roller main body 210, the side roller support 220 which is coupled to the lower part of the side roller main body 210, the fixing member 230 which is coupled to the side roller support 220 inside the side roller main body 210, and the washer 340 which is coupled between the side roller main body 210 and the side roller support 220.

The washer 340 is formed in a ring shape to have a predetermined washer height wh, and may be attached to or detached from the lower part of the side roller main body 210. The washer 340 may be coupled with the lower part of the side roller main body 210 when the side roller main body 210 is disposed at the normal position, or may be coupled with the lower part of the side roller main body 210 when the side roller main body 210 is turned upside down in the vertical direction.

In the case where the side roller main body 210 is disposed at the normal position, if the washer 340 is seated in the second space 213 of the side roller main body 210, when the substrate S is transferred by the transfer rollers 100 (see FIG. 1), the position of the contact line where the side surface of the substrate S is in contact with the side roller main body 210 is different from the position spaced by the first height h1 (see FIG. 6) from the lower end of the side roller main body 210.

Further, in the case where the side roller main body 210 is disposed while being turned upside down in the vertical direction, if the washer 340 is seated in the first space 212 of the side roller main body 210, when the substrate S is transferred by the transfer rollers 100 (see FIG. 1), the position of the contact line where the side surface of the substrate S is in contact with the side roller main body 210 is different from the position spaced by the second height h2 (see FIG. 7) from the lower end of the side roller main body 210.

In this way, the washer 340 is coupled with the lower part of the side roller main body 210 when the side roller main body 210 is disposed at the normal position, or coupled with the lower part of the side roller main body 210 when the side roller main body 210 is disposed while being turned upside down in the vertical direction. Accordingly, it is possible to vary the position of the contact line where the side surface of the substrate S is in contact with the side roller main body 210 when the substrate S is transferred by the transfer rollers 100 (see FIG. 1). Here, the position of the contact line where the side surface of the substrate S is in contact with the side roller main body 210 when the substrate S is transferred by the transfer rollers 100 (see FIG. 1) may be varied according to the washer height wh of the washer 340. Some embodiments select one of 1) the washer 340 having a first washer height, 2) the washer 340 having a second washer height greater than the first washer height, and 3) the washer 340 having a third washer height greater than the second washer height. The selected washer may be coupled with the lower part of the side roller main body 210. In these embodiments, it is possible to variously change the position of the contact line where the side surface of the substrate S is in contact with the side roller main body 210 when the substrate S is transferred by the transfer rollers 100 (see FIG. 1).

As described above, the substrate transferring device in accordance with present embodiment includes 1) the side roller main body 210 that includes the first space 212 having the first depth d1 in the upper part and the second space 213 having the second depth d2 different from the first depth d1 in the lower part, and 2) the washer 340 which is coupled with the second space 213 or the first space 212. Accordingly, it is possible to vary the position of the contact line where the side surface of the substrate S is in contact with the side roller main body 210 by changing the vertical position of the side roller main body 210, and also vary the position of the contact line through the washer 340.

Thus, even though a crack occurs in the side roller main body 210 along any one contact line when the substrate S is transferred, the side roller main body 210 may be reused while being turned upside down in the vertical direction without replacing the side roller main body 210. In addition, the side roller main body 210 may be reused by adjusting the height of the side roller main body 210 through the washer 340. Therefore, it is possible to further increase the replacement cycle of the side roller main body 210.

Figure 9:
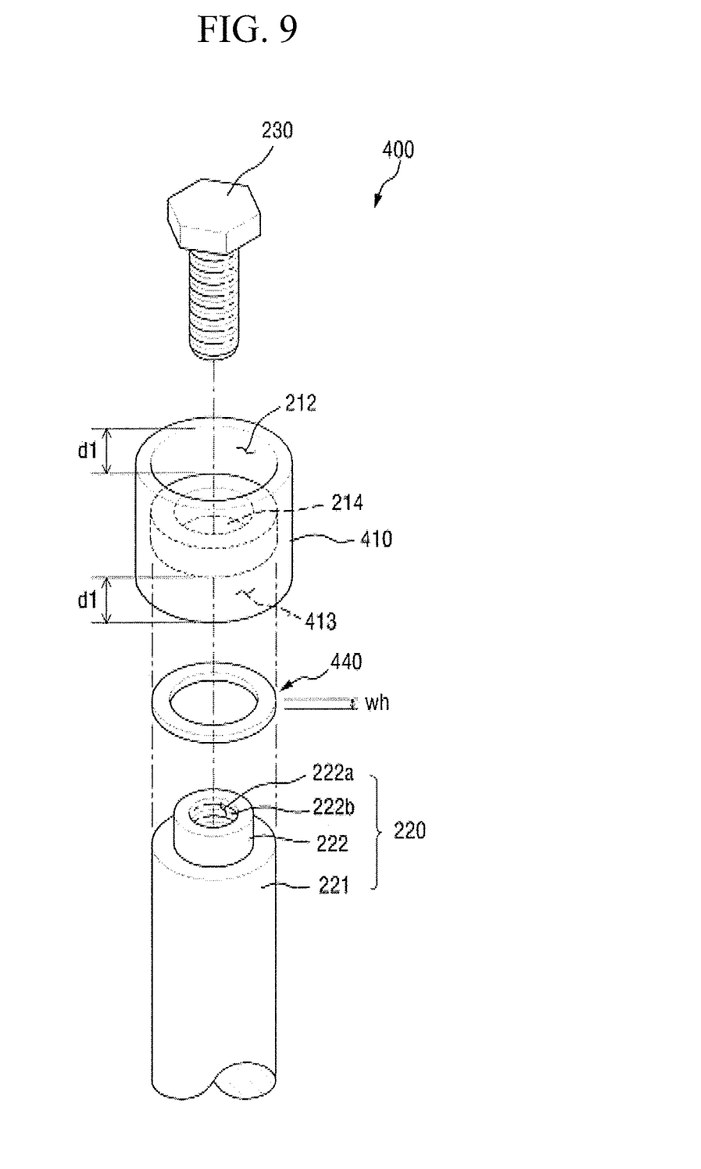
FIG. 9 is an exploded perspective view showing a side roller of a substrate transferring device in accordance with still another embodiment.

FIG. 9 is an exploded perspective view showing a side roller of a substrate transferring device in accordance with still another embodiment. The FIG. 9 embodiment has substantially the same configuration as the FIG. 1 embodiment except that the structure of a side roller main body 410 is different and a side roller 400 further includes a washer 440. Accordingly, a repeated description thereof will be omitted.

Referring to FIG. 9, the side roller 400 includes the side roller main body 410, the side roller support 220 which is coupled to the lower part of the side roller main body 410, the fixing member 230 which is coupled to the side roller support 220 inside the side roller main body 410, and the washer 440 which is coupled between the side roller main body 410 and the side roller support 220.

The side roller main body 410 is similar to the side roller main body 210 of FIG. 3. However, a second space 413 of the side roller main body 410 has substantially the same depth as the first depth d1 of the first space 212.

The washer 440 is formed in a ring shape to have a predetermined washer height wh, and may be attached to or detached from the lower part of the side roller main body 410.

If the washer 440 is seated in the second space 413 of the side roller main body 410, when the substrate S is transferred by the transfer rollers 100 (see FIG. 1), the position of the contact line where the side surface of the substrate S is in contact with the side roller main body 410 is different from the position spaced by the first height h1 (see FIG. 6) from the lower end of the side roller main body 410.

In this way, the washer 440 is coupled with the lower part of the side roller main body 410, thereby varying the position of the contact line where the side surface of the substrate S is in contact with the side roller main body 410 when the substrate S is transferred by the transfer rollers 100 (see FIG. 1). Here, the position of the contact line where the side surface of the substrate S is in contact with the side roller main body 410 when the substrate S is transferred by the transfer rollers 100 (see FIG. 1) may be varied according to the washer height wh of the washer 440. Some embodiments select one of 1) the washer 440 having a first washer height, 2) the washer 440 having a second washer height greater than the first washer height, and 3) the washer 340 having a third washer height greater than the second washer height, and couple the selected washer with the lower part of the side roller main body 410. In these embodiments, it is possible to variously change the position of the contact line where the side surface of the substrate S is in contact with the side roller main body 410 when the substrate S is transferred by the transfer rollers 100 (see FIG. 1).

As described above, the substrate transferring device in accordance with the present embodiment includes the washer 440 which has substantially the same depth in the upper and lower parts and is coupled with the lower part of the side roller main body 410. Accordingly, it is possible to vary the position of the contact line where the side surface of the substrate S is in contact with the side roller main body 410 through the washer 440. Thus, even though a crack occurs in the side roller main body 410 along the contact line ct1 (see FIG. 6) when the substrate S is transferred, the side roller main body 410 may be reused by adjusting the height of the side roller main body 410 through the washer 440 without replacing the side roller main body 410. Therefore, it is possible to increase the replacement cycle of the side roller main body 410.

According to at least one of the disclosed embodiments, by varying the position of the contact line where the side surface of the substrate is in contact with the side roller main body, the side roller main body can be reused, even though a crack occurs in the side roller main body along any one contact line. Therefore, it is possible to increase the replacement cycle of the side roller main body.

In concluding the detailed description, those skilled in the art will appreciate that many variations and modifications can be made to the disclosed embodiments without substantially departing from the principles of the present invention. Therefore, the disclosed re used in a generic and descriptive sense only and not for purposes of limitation.

What is claimed is:

1. A substrate transferring device comprising:
   a plurality of transfer rollers configured to rotate while contacting a lower surface of a substrate to transfer the substrate in one direction; and
   a plurality of side rollers, each comprising: 1) a side roller main body configured to rotate while contacting a side surface of the substrate, 2) a side roller support which is coupled to a first part of the side roller main body or a second part of the side roller main body, wherein the first and second parts are opposing each other, and 3) a fixing member which is coupled to the side roller support inside the side roller main body,
   wherein the side roller main body has a column shape, and comprises:
   a first space having a first depth in a substantially vertical direction from an upper surface formed on the second part;
   a second space having a second depth different from the first depth in the substantially vertical direction from a lower surface formed on the first part; and
   a fixing hole which connects the first space with the second space and into which a portion of the side roller support is inserted.

2. The substrate transferring device of claim 1, wherein the second depth is greater than the first depth.

3. The substrate transferring device of claim 1, wherein the side roller support comprises:
   a support main body having a column shape; and
   a support coupling portion formed in a column shape on the support main body, and having a through hole which is coupled to the fixing member.

4. The substrate transferring device of claim 3, wherein the support coupling portion is inserted into the fixing hole.

5. The substrate transferring device of claim 3, wherein the support main body is seated in the second space, or seated in the first space when the side roller is inverted in the vertical direction.

6. The substrate transferring device of claim 5, wherein when the support main body is seated in the second space, the contact line is positioned to be spaced by a first height from a lower end of the side roller main body, and
   wherein, when the support main body is seated in the first space, the contact line is positioned to be spaced, by a second height different from the first height, from the lower end of the side roller main body.

7. The substrate transferring device of claim 3, wherein the fixing member is a bolt, and wherein a thread is formed on an inner surface of the through hole.

8. A substrate transferring device comprising:
   a plurality of transfer rollers configured to rotate while contacting a lower surface of a substrate to transfer the substrate in one direction;
   a plurality of side rollers, each comprising: 1) a side roller main body configured to rotate while contacting a side surface of the substrate, 2) a side roller support which is coupled to a first part of the side roller main body or a second part of the side roller main body, wherein the first and second parts are opposing each other, and 3) a fixing member which is coupled to the side roller support inside the side roller main body; and
   a washer which is detachably coupled between the side roller main body and the side roller support.

9. The substrate transferring device of claim 8, wherein a position of the contact line is configured to vary according to a washer height of the washer.

10. The substrate transferring device of claim 8, wherein the washer has one of a first washer height, a second washer height greater than the first washer height, and a third washer height greater than the second washer height.

11. The substrate transferring device of claim 8, wherein the washer has a ring shape, and is coupled to the first part of the side roller main body or the second part of the side roller main body when the side roller main body is inverted in the vertical direction.

12. A substrate transferring device comprising:
a plurality of transfer rollers configured to rotate while contacting a lower surface of a substrate to transfer the substrate in one direction; and
a plurality of side rollers, each comprising 1) a side roller main body configured to rotate while contacting a side surface of the substrate, 2) a side roller support which is coupled to a first part of the side roller main body or a second part of the side roller main body, wherein the first and second parts are opposing each other, and wherein a detachable washer is interposed between the side roller support and one of the first and second parts of the side roller main body, and 3) a fixing member which is coupled to the side roller support inside the side roller main body.

13. The substrate transferring device of claim 12, wherein the side roller main body has a column shape, and comprises:
a first space having a first depth in a substantially vertical direction from an upper surface formed on the second part;
a second space having a second depth substantially equal to the first depth in the substantially vertical direction from a lower surface formed on the first part; and
a fixing hole which connects the first space with the second space and into which a portion of the side roller support is inserted.

14. The substrate transferring device of claim 13, wherein the side roller support comprises:
a support main body having a column shape; and
a support coupling portion formed in a column shape on the support main body, and having a through hole which is coupled to the fixing member.

15. The substrate transferring device of claim 14, wherein the support coupling portion is inserted into the fixing hole.

16. The substrate transferring device of claim 14, wherein the support main body is seated in the second space, or seated in the washer coupled to the second space.

17. The substrate transferring device of claim 16, wherein when the support main body is seated in the second space, the contact line is positioned to be spaced by a first height from a lower end of the side roller main body, and
wherein, when the support main body is seated in the washer, the contact line has a position different from the position spaced by the first height from the lower end of the side roller main body.

18. The substrate transferring device of claim 14, wherein the fixing member is a bolt, and wherein a thread is formed on an inner surface of the through hole.

19. The substrate transferring device of claim 12, wherein a position of the contact line is configured to vary according to a washer height of the washer.

* * * * *